(12) United States Patent
Carey et al.

(10) Patent No.: US 6,756,128 B2
(45) Date of Patent: Jun. 29, 2004

(54) LOW-RESISTANCE HIGH-MAGNETORESISTANCE MAGNETIC TUNNEL JUNCTION DEVICE WITH IMPROVED TUNNEL BARRIER

(75) Inventors: Matthew J. Carey, San Jose, CA (US); Bruce A. Gurney, San Rafael, CA (US); Yongho Ju, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/291,119

(22) Filed: Nov. 7, 2002

(65) Prior Publication Data

US 2004/0091744 A1 May 13, 2004

(51) Int. Cl.⁷ .......................... G11C 11/02; G11C 11/14; G11C 11/15
(52) U.S. Cl. ...................... 428/457; 428/692; 428/693; 360/324; 360/324.1; 360/324.2
(58) Field of Search ................................. 428/457, 692, 428/693; 360/324.1, 324.2, 324

(56) References Cited

U.S. PATENT DOCUMENTS

| | | |
|---|---|---|
| 5,465,185 A | 11/1995 | Heim et al. |
| 5,640,343 A | 6/1997 | Gallagher et al. |
| 5,729,410 A * | 3/1998 | Fontan, Jr. et al. ......... 360/113 |
| 5,835,314 A * | 11/1998 | Moodera et al. ............ 360/113 |
| 6,183,859 B1 * | 2/2001 | Chen et al. ................. 428/332 |
| 6,226,160 B1 | 5/2001 | Gallagher et al. |
| 6,347,049 B1 * | 2/2002 | Childress et al. ........... 365/173 |
| 6,359,289 B1 | 3/2002 | Parkin et al. |
| 2002/0114112 A1 * | 8/2002 | Nakashio et al. ........ 360/324.2 |

OTHER PUBLICATIONS

R. Jansen et al., "Influence of barrier impurities on the magnetoresistance in ferromagnetic tunnel junctions", J Appl Phys. 83, 11(Jun. 1, 1998) pp. 6682–6684.

M. Sharma et al., "Spin–dependent tunneling junctions with AlN and AlON barriers", Appl. Phys. Lett. 77, 14 (Oct. 2, 2000) pp. 2219–2221.

De Teresa et al., "Manganite–based magnetic tunnel junctions: new ideas on spin–polarised tunneling", Journal of Magnetism and Magnetic Materials 211, 160–166, 2000.

P.K. Wong et al. "High conductance magnetoresistive tunnel junctions with multiply oxidized barrier", J. Appl. Phys. 83, 11 (Jun. 1, 1998) pp. 6697–6699.

* cited by examiner

Primary Examiner—Paul Thibodeau
Assistant Examiner—Nikolas J Uhlir
(74) Attorney, Agent, or Firm—Thomas R. Berthold; Daniel E. Johnson

(57) ABSTRACT

A low resistance magnetic tunnel junction device, such as a memory cell in a nonvolatile magnetic random access memory (MRAM) array or a magnetoresistive read head in a magnetic recording disk drive, has a titanium oxynitride ($TiO_xN_y$) layer as the single-layer tunnel barrier or as one of the layers in a bilayer tunnel barrier. In a bilayer barrier the other barrier layer is an oxide or nitride of Al, Si, Mg, Ta, [[Si]] and Y, such as $Al_2O_3$, AlN, $Si_3N_4$, MgO, $Ta_2O_5$, $TiO_2$, or $Y_2O_3$. The Ti barrier material can be alloyed with other known metals, such as Al and Mg, to produce barriers with $TiAlO_xN_y$ and $TiMgO_xN_y$ compositions.

18 Claims, 3 Drawing Sheets

LOW-RESISTANCE HIGH-MAGNETORESISTANCE MAGNETIC TUNNEL JUNCTION DEVICE WITH IMPROVED TUNNEL BARRIER

TECHNICAL FIELD

This invention relates to magnetic tunnel junction (MTJ) devices for memory, recording head and external magnetic field-sensing applications. More particularly the invention relates to a MTJ device that uses an improved insulating tunnel barrier that improves the properties of the MTJ.

BACKGROUND OF THE INVENTION

A magnetic tunnel junction (MTJ) is comprised of two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and the barrier layer and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as a memory cell in a nonvolatile magnetic random access memory (MRAM) array, as described in IBM's U.S. Pat. No. 5,640,343, and as a magnetic field sensor, such as a magnetoresistive read head in a magnetic recording disk drive, as described in IBM's U.S. Pat. No. 5,729,410.

FIG. 1 illustrates a cross-section of a conventional MTJ device. The MTJ 10 includes a bottom "fixed" ferromagnetic (FM) layer 18 as the bottom magnetic electrode, an insulating tunnel barrier layer 20, and a top "free" FM layer 32 as the top magnetic electrode. The MTJ 10 has bottom and top electrical leads, 12, 14, respectively, with the bottom lead 12 being formed on a suitable substrate. The FM layer 18 is called the "fixed" layer because its magnetic moment (magnetization direction) is prevented from rotation in the presence of applied magnetic fields in the desired range of interest for the MTJ device, i.e., the magnetic field caused by the write current applied to the memory cell from the read/write circuitry of the MRAM or the magnetic field from the recorded magnetic layer in a magnetic recording disk. The magnetic moment of FM layer 18 can be fixed by being formed of a high-coercivity material or by being exchange coupled to an antiferromagnetic layer. The fixed FM layer may also be the laminated or antiparallel (AP) pinned type of structure, as described in IBM's U.S. Pat. No. 5,465,185. The magnetic moment of the free FM layer 32 is not fixed, and is thus free to rotate in the presence of an applied magnetic field in the range of interest. In the absence of an applied magnetic field the moments of the FM layers 18 and 32 are aligned generally parallel (or antiparallel) in a MTJ memory cell and generally perpendicular in a MTJ magnetoresistive read head. The relative orientation of the magnetic moments of the FM layers 18, 32 affects the tunneling current and thus the electrical resistance of the MTJ device.

An important parameter for MTJ device applications is high signal-to-noise ratio (SNR). The magnitude of the signal is dependent upon the magnetoresistance or MR ($\Delta R/R$) exhibited by the device. The magnetoresistance (MR) of a MTJ device is also referred to as the tunneling magnetoresistance (TMR). The signal is given by $i_B \Delta R$, which is the bias current ($i_B$) passing through the MTJ device (assuming a constant current is used to detect the signal) times the resistance change ($\Delta R$) of the device. However, the noise exhibited by the MTJ device is determined, in large part, by the resistance R of the device. Thus to obtain the maximum SNR for constant power used to sense the device the resistance (R) of the device must be small and the change in resistance ($\Delta R$) of the device large.

The resistance of a MTJ device is largely determined by the resistance of the insulating tunnel barrier layer for a device of given dimensions since the resistance of the electrical leads and the ferromagnetic layers contribute little to the resistance. Moreover, because the sense current passes perpendicularly through the ferromagnetic layers and the tunnel barrier layer, the resistance R of a MTJ device increases inversely with the area A of the device. The requirement for low resistance MTJ devices, coupled with the inverse relationship of resistance with area, is especially troublesome because an additional requirement for MTJ device applications is small area. For an MRAM the density of MTJ memory cells in the array depends on small area MTJs, and for a read head high storage density requires small data trackwidth on the disk, which requires a small area MTJ read head. Since the resistance R of a MTJ device scales inversely with the area A, it is convenient to characterize the resistance of the MTJ device by the product of the resistance R times the area A (RA). Thus RA is independent of the area A of the MTJ device.

In the prior art, the material used for the tunnel barrier layer is aluminum oxide ($Al_2O_3$) because such barrier layers can be made very thin and essentially free of pin holes or other defects. For $Al_2O_3$ barrier layers it has been found that RA increases exponentially with the thickness of the layer. The thickness of $Al_2O_3$ barrier layers can be varied over a sufficient range to vary RA by more than eight orders of magnitude, i.e., from more than $2 \times 10^9$ $\Omega(\mu m)^2$ to as little as 5 $\Omega(\mu m)^2$. However, for these lower RA values, the TMR is typically reduced, in part because of microscopic pin holes or other defects in the ultra thin tunnel barrier layers needed to obtain these very low RA values. For MRAM applications RA values in the range 500–1000 $\Omega(\mu m)^2$ are acceptable, although it would be useful to be able to prepare MTJ memory cells with even lower RA values so that, for example, current could be passed perpendicularly through the MTJ cell to aid in the writing of the cell. Moreover, for scaling to ever higher memory capacities, MRAM cells will need to be shrunk in size, requiring lower RA values so that the resistance of the cell is not too high. More importantly, for MTJ read heads to be competitive in SNR with conventional giant magnetoresistance (GMR) spin-valve read heads, the MTJ heads need to have resistance values comparable to those of GMR heads. Since read heads of sub-micron size are required for high density recording applications, MTJ heads with RA values lower than 5 $\Omega(\mu m)^2$ are desirable, which is an RA value less than what can be obtained with $Al_2O_3$ tunnel barriers.

U.S. Pat. No. 5,835,314 suggests that MTJ devices can be made with tunnel barriers formed of AlN, $Si_3N_4$, MgO, $Ta_2O_5$, $TiO_2$, and $Y_2O_3$.

R. Jansen et al. (*J Appl. Phys.*, 83, 11 (June 1998)) describe the effect of adding impurities such as Co, Pd, Cu or Ni into the middle of the insulating aluminum oxide barrier to affect the TMR. A single layer of aluminum oxynitride has been proposed as a tunnel barrier layer for reducing the resistance of the MTJ device in U.S. Pat. No.

6,183,859, and by M. Sharma et al. (*Appl. Phys. Lett.* 77, 14 (Oct. 2, 2000)).

The literature also describes other types of bilayers or multiple barriers being used in tunneling structures, but all of these are high resistance devices. De Teresa et al. (*Journal of Magnetism and Magnetic Materials* 211, 160–166 (2000)) describes the dependence of the TMR effect on the magnetic layer/barrier interface, such as $Co/Al_2O_3$ vs. $Co/SrTiO_3$. Bilayer barriers, such as $SrTiO_3/Al_2O_3$, were used to illustrate the effect of different interfaces on the two magnetic electrodes. P. K. Wong et al. (*J. Appl. Phys.* 83, 11 (Jun. 1, 1998)) prepared, as shown in Table 1, an MTJ device with a tunnel barrier of a bottom $Al_2O_3$/top MgO bilayer formed by sputter depositing Al/Mg in an oxygen atmosphere, but that device resulted in a high RA product of $1.2 \times 10^8$ $\Omega(\mu m)^2$. Again, in contrast to the present invention, these studies concern tunnel barriers with much higher resistance (about $2 \times 10^4$ $\Omega(\mu m)^2$ and higher) and do not address the applicability of bilayer barriers to low-resistance (low RA) magnetic tunnel junction devices.

IBM's U.S. Pat. No. 6,359,289 describes low-RA MTJ devices with tunnel barrier layers formed of oxides and nitrides of indium (In) and gallium (Ga), and bilayer tunnel barriers comprised of a thin layer of aluminum oxide or nitride and an indium or gallium oxide or nitride layer.

IBM's U.S. Pat. No. 6,347,049 describes low-RA MTJ devices with bilayer tunnel barrier layers comprised of either $MgO/Al_2O_3$ or $AlN/Al_2O_3$.

The previously cited '859 patent describes low resistance MTJ devices with aluminum oxynitride ($AlO_xN_y$) tunnel barriers formed by exposing Al to a plasma mixture of oxygen and nitrogen. The tunnel barriers can include trace amounts of Cu, Si, Ta or Ti.

Thus, it is desirable to develop MTJ devices with improved tunnel barrier materials so that lower RA values can be achieved without sacrificing high TMR.

SUMMARY OF THE INVENTION

The invention is a low resistance magnetic tunnel junction device with a titanium oxynitride ($TiO_xN_y$) layer as the single-layer tunnel barrier or as one of the layers in a bilayer tunnel barrier, the other barrier layer in the bilayer being an oxide or nitride of Al, Si, Mg, Ta, and Y, such as $Al_2O_3$, AlN, $Si_3N_4$, MgO, $Ta_2O_5$, $TiO_2$, or $Y_2O_3$. The Ti barrier material can be alloyed with other known metals, such as Al and Mg, to produce barriers with $TiAlO_xN_y$ and $TiMgO_xN_y$ compositions. These alloyed types of barriers are formed by depositing a film of the TiAl or TiMg alloy, followed by natural exposure to the $O_2/N_2$ gas mixture.

For a fuller understanding of the nature and advantages of the invention, reference should be made to the following detailed description taken together with the accompanying figures.

DESCRIPTION OF THE PREFERRED EMBODIMENTS

Figure 1:
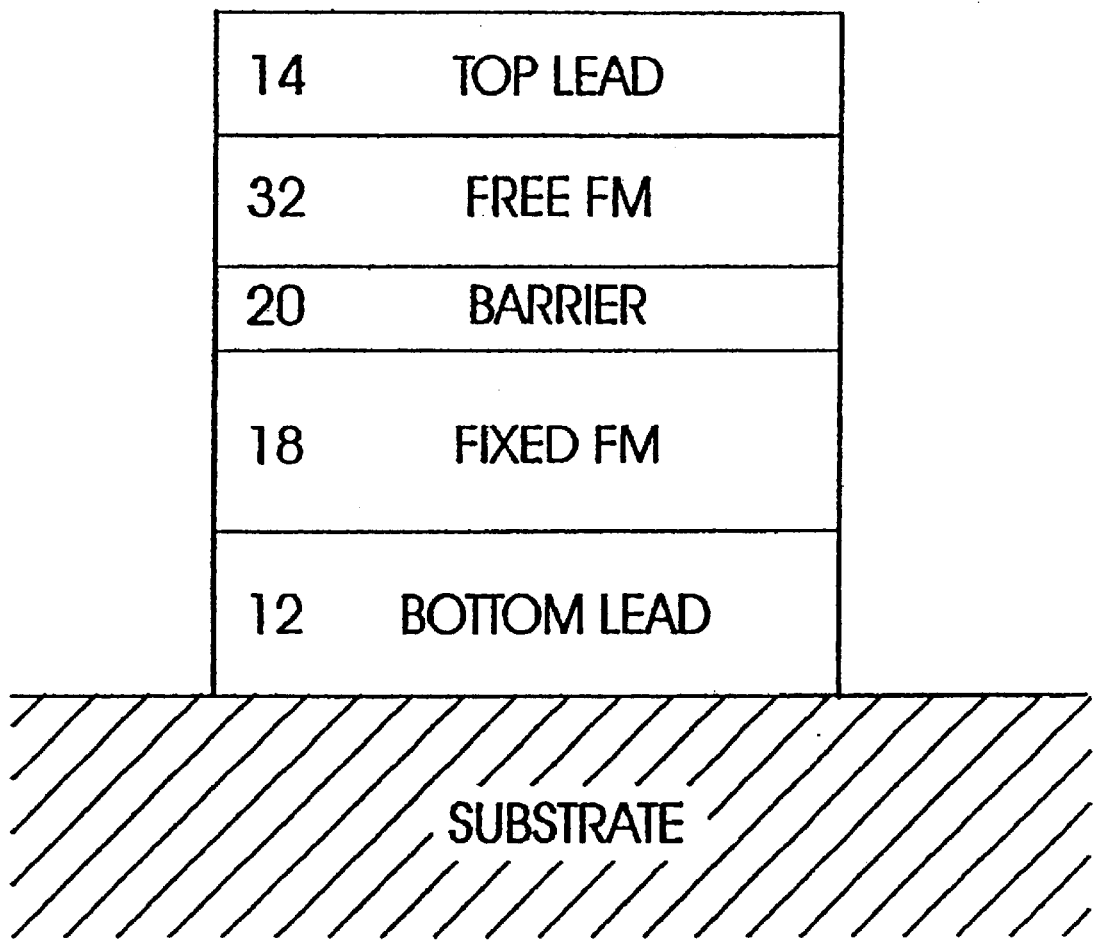
FIG. 1 shows a cross-section view of a conventional MTJ sensor.
Figure 2:
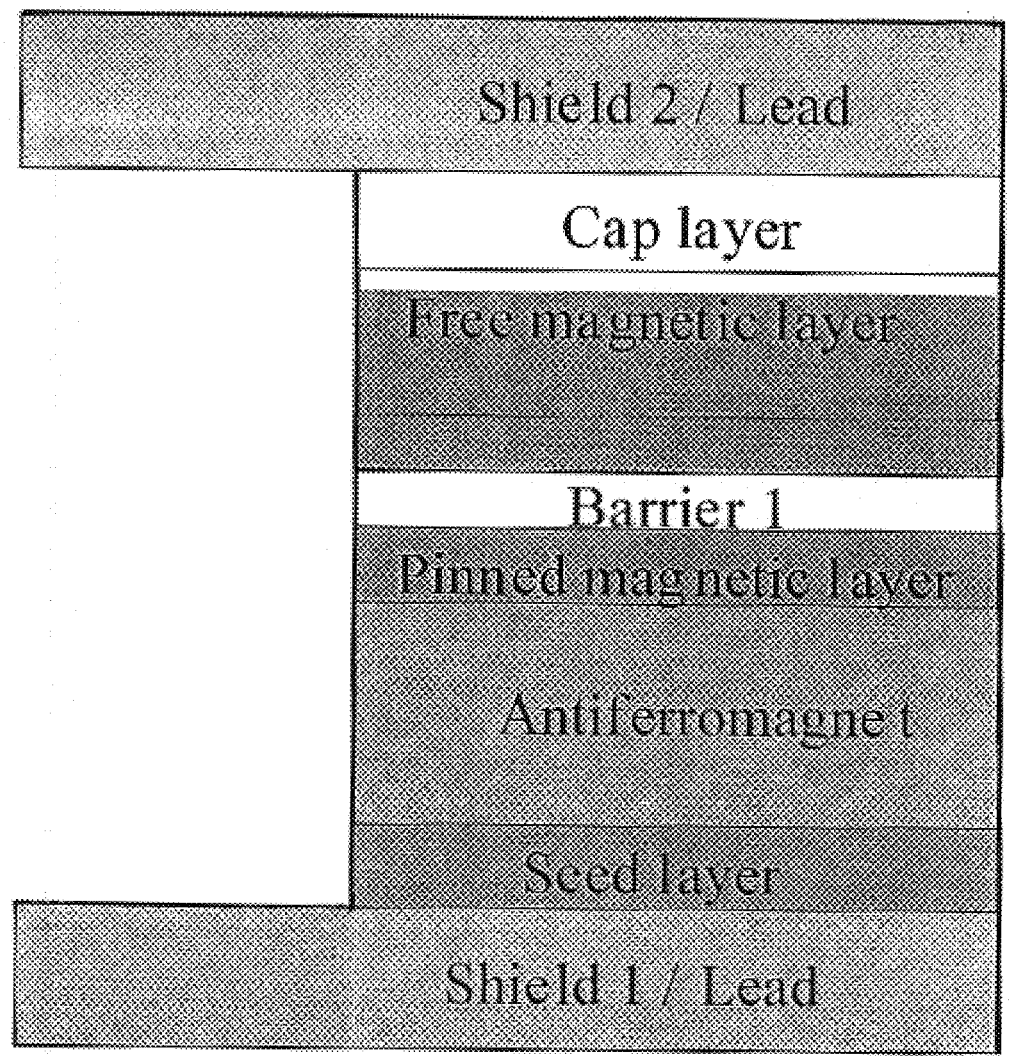
FIG. 2 shows a cross-section of a MTJ sensor with a single layer tunnel barrier.

The MTJ device of present invention is shown in FIG. 2. The MTJ device is depicted as a read head and thus includes a first magnetic shield 1 as a substrate and that also serves as the bottom lead, a cap layer over the free magnetic layer and a second magnetic shield 2 that also serves as the top electrical lead. The pinned magnetic layer can be an AP-pinned structure. In the preferred embodiment the insulating tunnel barrier is a single layer of titanium oxynitride ($TiO_xN_y$). The invention is directed to MTJ devices with low specific junction resistances, i.e., less than $1000 \, \Omega(\mu m)^2$, and in the specific types of devices fabricated, the RA values are in the range of $1-200 \, \Omega(\mu m)^2$.

Structures with the following form were fabricated and tested for RA and TMR:

50 Å Ti/10 Å Cu/100 Å IrMn/30 Å Co/$TiO_xN_y$ Barrier/10 Å Co/40 Å NiFe/150 Å Ti The $TiO_xN_y$ barrier was formed by sputter depositing a Ti film and then naturally exposing it to an $O_2/N_2$ gas mixture. The Ti was exposed for 20 minutes in a chamber at 500 mTorr with $O_2$ and $N_2$ being introduced at the same rate of 10 sccm, so that the gas mixture was approximately $O_2(50\%)/N_2(50\%)$. This natural exposure to the $O_2/N_2$ is in contrast to the use of a plasma, as described in the prior art for the formation of aluminum oxynitride and $TiO_x$. The composition of the $TiO_xN_y$ preferably has Ti present in the range of approximately 25 to 75 atomic %, preferably 33 to 50 atomic %, with the remainder being the oxygen and nitrogen. The relative amounts of oxygen to nitrogen should be in the range of 95:5 to 50:50. Thus the composition of the $TiO_xN_y$ can be expressed as $Ti_z(O_xN_{100-x})_{100-z}$, where z is 25 to 75 and x is 50 to 95.

In one example of the above MTJ structure and process a 7 Å Ti film was used to form the barrier and resulted in a measured RA of 2 $\Omega(\mu m)^2$ and a TMR of 20%. In another example a 6 Å Ti film resulted in a measured RA of 1 $\Omega(\mu m)^2$ and a TMR of 29%. For comparison, MTJ devices with barriers of $TiO_x$ were formed in a similar process but by natural oxidation without exposure to $N_2$. These devices had poor TMR of less than 5%. Thus the use of $N_2$ as part of the natural exposure process to produce $TiO_xN_y$ barriers instead of $TiO_x$ barriers results in significant improvement in TMR.

While the experimental samples were MTJ devices with $TiO_xN_y$ barriers, it is likely that alloying the Ti barrier material with other known metals, such as Al and Mg, to produce barriers with $TiAlO_xN_y$ and $TiMgO_xN_y$ compositions, would also result in low RA and high TMR. These types of barriers are formed by depositing a film of the TiAl or TiMg alloy, followed by natural exposure to the $O_2/N_2$ gas mixture.

Figure 3:
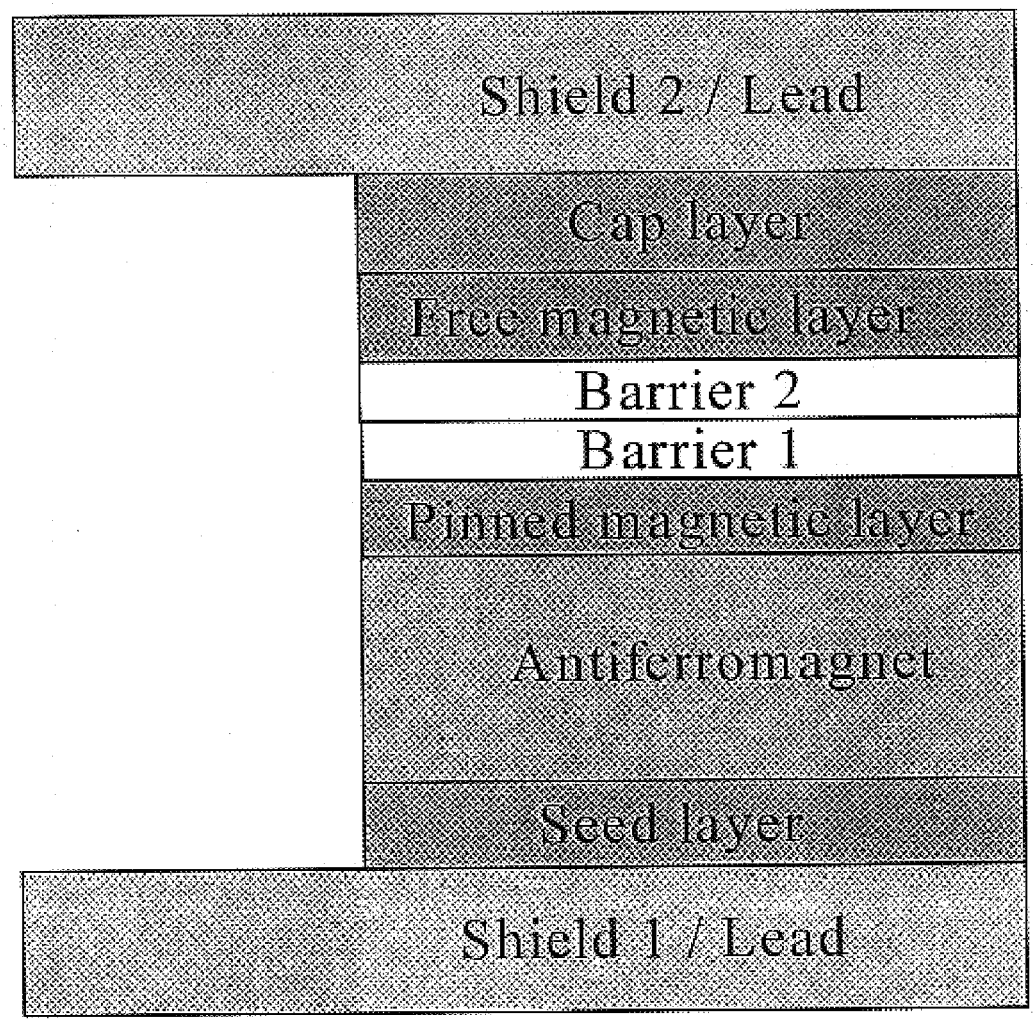
FIG. 3 shows a cross-section of a MTJ sensor with bilayer tunnel barrier.

As shown in the embodiment of FIG. 3, the tunnel barrier is a bilayer with one of the barrier layers being titanium oxynitride ($TiO_xN_y$) and the other barrier layer being an oxide or nitride of Al, Si, Mg, Ta, and Y, such as $Al_2O_3$, AlN, $Si_3N_4$, MgO, $Ta_2O_5$, $TiO_2$, or $Y_2O_3$.

The advantages of the bilayer barrier are:

1) Barrier 2 can be used to cap or plug physical pinholes in barrier 1 when barrier 1 is very thin. These pinholes, if not plugged by an insulator, lead to electrical shorting and low TMR.
2) Because barrier 1 and barrier 2 are different materials they can be used to control the interfacial chemistry and chemical interdiffusion with each magnetic electrode layer.
3) The insulating barrier height of each thin barrier can be advantageously made to be very different. The specific MTJ impedance may then be dominated by the tunneling characteristics through the thin barrier with the larger barrier height, but the physical separation between the free and pinned ferromagnetic layers is still the total thickness of the multiple barriers, thus reducing the magnetic coupling between the free and pinned layers.

One particular advantageous bilayer structure is AlN/TiO$_x$N$_y$. Because AlN is reasonably stable it is believed that exposure of the AlN to oxygen during the process would not substantially oxidize the bottom AlN layer, so that the bottom layer in the bilayer consists essentially of only AlN. An advantage of using the AlN as the bottom layer is that because it is on top of the bottom ferromagnetic layer of the MTJ device it protects the bottom ferromagnetic layer from exposure to oxygen that would degrade its magnetic and tunneling properties. Thus in this invention the use of a bilayer tunnel barrier allows simultaneous and independent improvements of the two barrier/electrode interfaces in the tunnel junction.

While the invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:
   a first ferromagnetic layer and a second ferromagnetic layer, one of the ferromagnetic layers having its magnetic moment fixed in a preferred direction in the presence of an applied magnetic field in the range of interest and the other of the ferromagnetic layers having its magnetic moment free to rotate in the presence of an applied magnetic field in the range of interest; and
   a titanium oxynitride tunnel barrier located between the first and second ferromagnetic layers, wherein the device has a resistance-area product of less than 1000 $\Omega(\mu m)^2$ and a tunneling magnetoresistance ratio of at least 20%.

2. The magnetic tunnel junction device according to claim 1 wherein the titanium oxynitride has the composition of the form Ti$_z$(O$_x$N$_{100-x}$)$_{100-z}$, where z is between 25 and 75 and x is between 50 and 95, in which x and z represent atomic percent.

3. The magnetic tunnel junction device according to claim 1 wherein the barrier comprises a material selected from the group consisting of titanium-aluminum oxynitride and titanium-magnesium oxynitride.

4. The magnetic tunnel junction device according to claim 1 wherein the barrier is a bilayer, wherein the first layer is selected from the group consisting of an oxide or nitride of Al, Si, Mg, Ta, and Y, and wherein the titanium oxynitride is the second layer.

5. The magnetic tunnel junction device according to claim 4 wherein the bilayer barrier is AlN/TiO$_x$N$_y$.

6. The magnetic tunnel junction device according to claim 1 wherein the device is a magnetoresistive read head.

7. The magnetic tunnel junction device according to claim 1 wherein the device is a magnetic memory cell.

8. The magnetic tunnel junction device according to claim 1 wherein the first ferromagnetic layer has its magnetic moment fixed and further comprising a layer of antiferromagnetic material in contact with the fixed ferromagnetic layer for pinning the magnetic moment of the fixed ferromagnetic layer.

9. A magnetic tunnel junction read sensor comprising:
   a first electrical lead;
   a fixed ferromagnetic layer having a magnetic moment that is fixed in a preferred direction in the presence of an applied magnetic field in the range of interest;
   an antiferromagnetic layer between the first lead and the fixed ferromagnetic layer for pinning the magnetic moment of the fixed ferromagnetic layer in its fixed direction;
   a free ferromagnetic layer whose magnetic moment is free to rotate in the presence of an applied magnetic field in the range of interest;
   a titanium oxynitride tunnel barrier located between the first and second ferromagnetic layers; and
   a second electrical lead on the free ferromagnetic layer, wherein the sensor has a resistance-area product of less than 1000 $\Omega(\mu m)^2$ and a tunneling magnetoresistance ratio of at least 20%.

10. The magnetic tunnel junction read sensor according to claim 9 wherein the titanium oxynitride has the composition of the form Ti$_z$(O$_x$N$_{100-x}$)$_{100-z}$, where z is between 25 and 75 and x is between 50 and 95, in which x and z represent atomic percent.

11. The magnetic tunnel junction read sensor according to claim 9 wherein the barrier comprises a material selected from the group consisting of titanium-aluminum oxynitride and titanium-magnesium oxynitride.

12. The magnetic tunnel junction read sensor according to claim 9 wherein the barrier is a bilayer, wherein the first layer is selected from the group consisting of an oxide or nitride of Al, Si, Mg, Ta, and Y, and wherein the titanium oxynitride is the second layer.

13. The magnetic tunnel junction read sensor according to claim 12 wherein the bilayer barrier is AlN/TiO$_x$N$_y$.

14. The device of claim 1 wherein the nitrogen content of the tunnel barrier is selected to increase the tunneling magnetoresistance of the device beyond what it would be in the absence of nitrogen.

15. The device of claim 1 wherein the device has a resistance-area product in the range of 1–200 $\Omega(\mu m)^2$.

16. The device of claim 9 wherein the nitrogen content of the tunnel barrier is selected to increase the tunneling magnetoresistance of the device beyond what it would be in the absence of nitrogen.

17. The device of claim 9 wherein the sensor has a resistance-area product in the range of 1–200 $\Omega(\mu m)^2$.

18. A magnetic tunnel junction device comprising: a first ferromagnetic layer and a second ferromagnetic layer, one of the ferromagnetic layers having its magnetic moment fixed in a preferred direction in the presence of an applied magnetic field in the range of interest and the other of the ferromagnetic layers having its magnetic moment free to rotate in the presence of an applied magnetic field in the range of interest; and a tunnel barrier consisting of titanium oxynitride located between the ferromagnetic layers, wherein the device has a resistance-area product of 1000 $\Omega(\mu m)^2$.

* * * * *